US012783764B2

(12) United States Patent
Israeli et al.

(10) Patent No.: US 12,783,764 B2
(45) Date of Patent: Nov. 3, 2026

(54) MODIFYING NETLISTS FOR DEVICE CHANGES IN IC DESIGNS

(71) Applicant: International Business Machines Corporation, Armonk, NY (US)

(72) Inventors: Itay Israeli, Haifa (IL); Israel A. Wagner, Zichron Yaakov (IL); Tobias Werner, Weil Im Schoenbuch (DE); Tai Anh Cao, Austin, TX (US); Hed Konen, Elyakhin (IL); Avital Rafaevich, Kiryat Ekron (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 712 days.

(21) Appl. No.: 18/348,149

(22) Filed: Jul. 6, 2023

(65) Prior Publication Data

US 2025/0013811 A1 Jan. 9, 2025

(51) Int. Cl.

| | |
|---|---|
| ***G06F 30/327*** | (2020.01) |
| *G06F 30/30* | (2020.01) |
| *G06F 30/32* | (2020.01) |
| *G06F 30/3308* | (2020.01) |
| *G06F 30/373* | (2020.01) |

(52) U.S. Cl.

CPC ............ *G06F 30/327* (2020.01); *G06F 30/30* (2020.01); *G06F 30/32* (2020.01); *G06F 30/3308* (2020.01); *G06F 30/373* (2020.01)

(58) Field of Classification Search

CPC ..................................................... G06F 30/327

See application file for complete search history.

(56) References Cited

U.S. PATENT DOCUMENTS 7,765,498 B1 * 7/2010 Ho ........................ G06F 30/398 716/133

10,970,438 B2 * 4/2021 Huang .................... G06F 30/30

(Continued)

FOREIGN PATENT DOCUMENTS

CN 115238616 A 10/2022

OTHER PUBLICATIONS

Eric Y. Chin et al., "Prediction of Interconnect Delay Variations using Pattern Matching," Design for Manufacturability through Design-Process Integration, Dated: Mar. 21, 2007, pp. 1-7.

(Continued)

*Primary Examiner* — Nghia M Doan

(74) *Attorney, Agent, or Firm* — Tihon Poltavets, Esq.; Blanche E. Schiller, Esq.; Heslin Rothenberg Farley & Mesiti P.C.

(57) ABSTRACT

Embodiments of the present disclosure provide systems and methods for efficiently performing device changes directly in an extracted netlist, without requiring independent changes in a schematic design or layout view of the IC design. A disclosed method accesses a netlist for a selected device in a given integrated circuit (IC) design; and identifies a change to be made in the netlist. The system performs, based on the selected change to the netlist, at least one of changing one or multiple parameters of the selected device; adding a second selected device; removing the selected device, or changing an interconnect. The system can implement changes to the netlist using batch processing.

20 Claims, 5 Drawing Sheets

(56) References Cited

U.S. PATENT DOCUMENTS

| | | | | |
|---|---|---|---|---|
| 11,048,843 | B1 | 6/2021 | Poplack et al. | |
| 2003/0125925 | A1 * | 7/2003 | Walther | G06F 30/30<br>703/22 |
| 2005/0204318 | A1 * | 9/2005 | Iadanza | G06F 30/367<br>716/102 |

OTHER PUBLICATIONS

Author et al., "Method for Linking of Schematic to Extracted Netlist," ip.com, IP.com No. IPCOM000159251D dated: Oct. 15, 2007, pp. 1-4.

Wing Chiu Tam et al., "Authomated Failure Population Creation for Validating Integrated Circuit Diagnosis Methods," 2009 46th ACM/IEEE Design Automation Conference, Dated: Aug. 28, 2009, pp. 1-6.

Jonathan Ho et al., "A Procedure to Back-annotate Process Induced Layout Dimension Changes into the Post Layout Simulation Netlist," Design for Manufacturability through Design-Process Integration II, Dated: Mar. 4, 2008, pp. 1-10.

* cited by examiner

MODIFYING NETLISTS FOR DEVICE CHANGES IN IC DESIGNS

BACKGROUND

The present invention relates to the integrated circuit (IC) design field, and more specifically, to systems and methods for modifying netlists to implement device changes in IC designs.

In IC chip designs, a netlist is a textual description listing connections of an electronic circuit. There are different netlist formats or types of netlists, which all correspond to the same functionality and are used in the electronic circuit design process. For example, one netlist corresponds to a Hardware Description Language (HDL) schematic description of the design of a given IC design. A netlist provides a post-layout design representation typically used for design verification, for example to verify design behavior and function, which considers parasitic effects in both the designed devices and required wiring interconnects. The netlist includes a description of the parts, devices or elements (e.g., often called instances) used in a given design. An instance could be a single transistor, such as a Fin field effect transistor (FinFET), a passive device such as a resistor or a capacitor, or a logic gate, such as a NAND gate, a NOR gate or an AND/OR gate. The netlist also includes interconnects or nets, which represent the wires connecting between different pins of the given design. Circuit simulation tools use the netlist to model the behavior of the circuit of a given IC design.

Circuit designers often change selected parameters of a certain device or instance and assess the impact from the change to tune the IC design. For example, a circuit designer may make a design change based on reviewing results of timing and power tools for a given IC design. For example, the circuit designer may change a device size to minimize path delay, or change various other device parameters, add or remove a device from the IC design. For example, the selected device may include a transistor, logic gate, or other instance within the IC design. For a typical design change, the circuit designer forwards the proposed change to a layout designer to process the proposed change or changes into a layout view of the IC design. The layout designer provides an updated design layout to include the proposed change or changes and a netlist is extracted for the updated design layout. Further processing typically includes running parasitic extraction to calculate parasitic effect in design devices and wiring interconnects, and re-running timing and power tools to verify operation as intended. For a given design, each of these conventional steps may take a few days to complete. A need exists for new techniques to effectively and efficiently implement various incremental design changes to develop an optimized final IC design, for example to achieve a final IC design with enhanced IC quality and performance. A need exists for new techniques to avoid some deficiencies of traditional design systems and that improves runtime performance for implementing design changes along the development process for a given IC design.

As used in the following description and claims, the terms "device" and "selected device" should be broadly understood to include a single device, a group of devices, a cell, a gate, an interface, and one or more nets and connecting wires. The terms "adding a device" and "removing a device" should be broadly understood to include connecting a device from a netlist, disconnecting a device from a netlist, and adding to a device name a unique label (e.g., UNUSED) indicating the device is not used or part of the modified netlist.

SUMMARY

Embodiments of the present disclosure provide systems and methods for modifying a netlist to implement device changes in an integrated circuit (IC) design.

A non-limiting disclosed computer implemented method comprises selecting a device in a given integrated circuit (IC) design, and accessing a netlist for the given IC design. The system determines a matching netlist name in the netlist based on the selected device, and identifies a selected change to be made in the netlist. The system performs, based on the selected change to the extracted netlist, at least one of (i) changing a parameter of the selected device; (ii) adding a second selected device, for example adding at least one transistor finger; (iii) removing a selected device, for example removing a transistor finger from the selected device, where the selected device comprises two or more transistor fingers; or (iv) changing an interconnect, such as changing a metal type, a metal length, or a metal width of the interconnect. The system implements changes to the netlist to provide a modified netlist, for example using batch processing. The system can verify the modified netlist and fabricate an integrated circuit based on the modified netlist.

Other disclosed embodiments include a computer control system and computer program product for modifying a netlist to implement device changes in an IC design, implementing features of the above-disclosed method.

DETAILED DESCRIPTION

Figure 1:
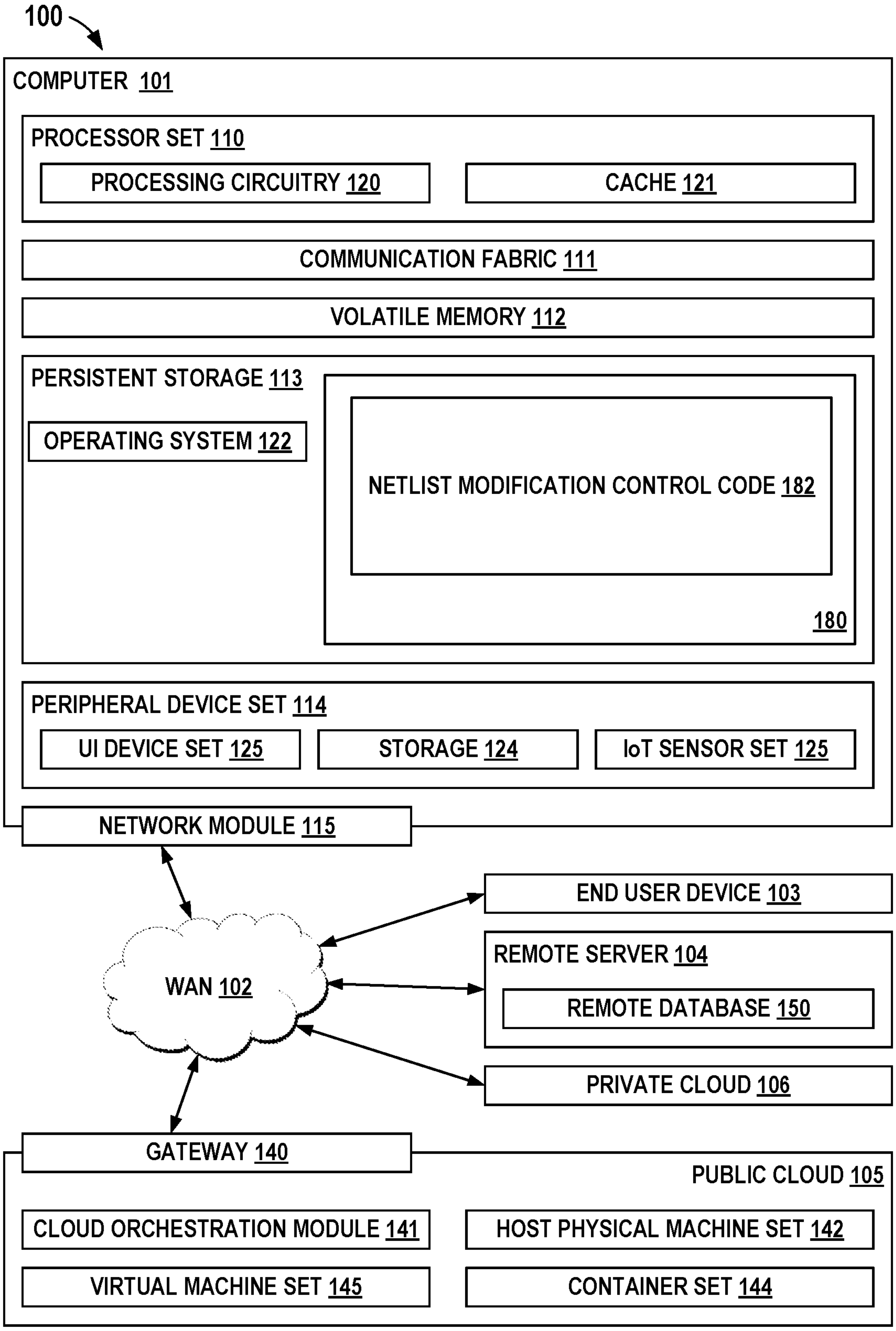
FIG. 1 is a block diagram of an example computer environment for use in conjunction with one or more disclosed embodiments for modifying a netlist to implement device changes in an IC design.

Embodiments of the present disclosure provide systems, techniques, and methods for efficiently performing device changes directly on an extracted netlist, without the need for independent changes in a schematic design or layout view of the IC design. Embodiments of the present disclosure improve productivity in custom IC designs by enabling faster incremental design steps along the development process. In a disclosed embodiment, a user, such as a circuit designer, selects a device in a given integrated circuit (IC) design, accesses a netlist for the given IC design, and selects a change to be made directly in the netlist.

In a given IC design, a device comprises at least one finger (e.g. presented in a schematic view of the IC design), and a cell, which comprises a group of devices. A field effect transistor (FET) or FinFET IC design typically includes multi-finger gate transistors for low-noise designs due to their low gate resistance, short channel effects and low W/L ratio. The multi-finger transistor layout includes the gate transistor split into multiple fingers in parallel. For example, the width of the transistor is divided by the number of fingers (nf) causing a smaller area occupation and a better matching compared to the single finger configuration. The multi-finger gate transistors can increase the capacity to handle the drain current while minimizing parasitics. A circuit designer may change a number of fingers for either or both P-channel or N-channel devices, for example to change the device gate resistance and/or frequency performance.

A circuit designer may change various device parameters, such as with the goal to minimize path delay, and the circuit designer may add a device or remove a device, add a group of devices or cell or remove a cell, and/or modify an interconnect or wires from the IC design. In conventional arrangements, the circuit designer provides the proposed changes in a schematic view of the IC design for processing by a layout designer, and the layout designer updates the design layout with the proposed change or changes. Next verification is performed based on the updated design layout by running parasitic extraction to calculate parasitic effect in design devices and wiring interconnects and re-running timing and power tools. Each of these steps typically require significant time, for example each step may take one or more days to complete.

In a disclosed embodiment, various proposed changes provided by a circuit designer are implemented directly in a netlist for a given IC design, eliminating the steps of generating an updated layout required for verification processing including re-running timing and power tools and running parasitic extraction. In a disclosed embodiment, various proposed changes provided by a circuit designer are implemented directly in a netlist, which enables running parasitic extraction to calculate parasitic effect in design devices and wiring interconnects, and running noise simulation tools, timing tools and power tools to verify operation as intended In a disclosed embodiment, a matching netlist name in the netlist is identified based on the selected device. The system performs, based on the selected change to the netlist, at least one of (i) changing a parameter of the selected device; (ii) adding a second selected device, for example adding at least one finger; (iii) removing a selected device, for example removing a finger from the selected device, where the selected device comprises two or more fingers; or (iv) changing an interconnect, such as changing a metal type or a metal width of the interconnect.

It should be understood that the selected device can include a cell, which comprises a group of devices. In a disclosed embodiment, the system can add and remove a cell. In a disclosed embodiment, the system performs disconnecting a cell, where the system removes each instance and device in the cell from the netlist, and also each wire associated with it (e.g., internal wires which are inside the cell and external wires that connect the cell to other parts of the design). In a disclosed embodiment, the system performs connecting a cell, where the system in first step generates an extracted netlist for only the specific cell, then tailoring that netlist to the extracted netlist of the design. In a disclosed embodiment, the system can perform changing an interconnect, which includes modifying one or more of a wire type, wire width, wire length, and wire spacing. In a disclosed embodiment, the system can modify wires in the netlist, where wires are represented by segments of R's (resistances) and C's (capacitances). In a disclosed embodiment, the system can disconnect a wire by removing each segment between the source and sink of that wire from the netlist. In a disclosed embodiment, the system can replace an existing wire with a new wire by using the net name of the existing wire being replaced. In a disclosed embodiment, the system can add new wires of different types, including a defined schematic wire characterization such as wire delay or a wire characterized by its type, width and length.

In a disclosed embodiment, the system implements changes to the netlist using batch processing to provide a modified netlist. The system can verify the modified netlist and fabricate an integrated circuit based on the modified netlist. Methods and techniques of the present disclosure enable a circuit designer to run noise simulation, timing and power design tools on the modified netlist to evaluate various different circuit changes in the IC design, for example within minutes instead of days required for existing design systems.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Referring to FIG. 1, a computing environment 100 contains an example of an environment for the execution of at least some of the computer code involved in performing the inventive methods, such as a Netlist Modification Control Code 182, at block 180. In addition to block 180, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 180, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 180 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 180 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economics of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Embodiments of the present disclosure include systems and methods to directly modify a netlist to implement device changes in an integrated circuit (IC) design. The system includes a Netlist Modification Framework used with the Netlist Modification Control Code to implement inventive methods of the present disclosure. The system includes a Netlist Modification Tool graphical user interface (GUI) configured to obtain user selections. A device in a given IC design is selected, and a netlist is obtained for the selected device in the given IC design. A change or multiple changes to be made in the netlist are selected by a user, such as a circuit designer. For example, the device is presented in a schematic view of the IC design, and the device comprises at least one finger, typically, the device includes multiple-finger transistors to provide low gate resistance, and increase current capacity. The user selected device can include a single transistor, such as a FinFET, a resistor, a capacitor, an interconnect, and a logic gate or cell, such as a NAND gate, a NOR gate or an AND/OR gate. The netlist includes interconnects or nets, which represent the wires connecting between different pins in the IC design. The circuit designer may make various device changes to the IC design, such as changing an interconnect, adding or removing a device, increasing or decreasing a number of transistor fingers or a type of finger (e.g., a P-finger of a P-channel FinFET or an N-finger of an N-channel FinFET), and adding and removing a cell. A matching netlist name in the netlist is identified based on the selected device for the device name. The system performs, based on the selected change or changes to the netlist, at least one of (i) changing a parameter of the selected device; (ii) adding a second selected device, for example adding at least on-one finger; (iii) removing a selected device, for example removing a finger from the selected device, where the selected device comprises two or more fingers; or (iv) changing a metal type or a metal width of an interconnect. The system implements the modified netlist including all the selected changes to the netlist, enabling the circuit designer to review and evaluate the changes and make various other changes to optimize a final circuit design.

In a disclosed embodiment, the modified netlist is effectively and efficiently implemented for example using batch processing, enabling enhanced runtime performance and avoiding the excessive time requirements of traditional systems. The modified netlist includes various user selected design changes and a format ready for running selected design verification tools, such as noise simulation, power and timing design tools. The modified netlist enables the circuit designer to efficiently verify various different design changes to achieve a final design to fabricate an integrated circuit including the selected user changes based on the modified netlist.

Figure 2:
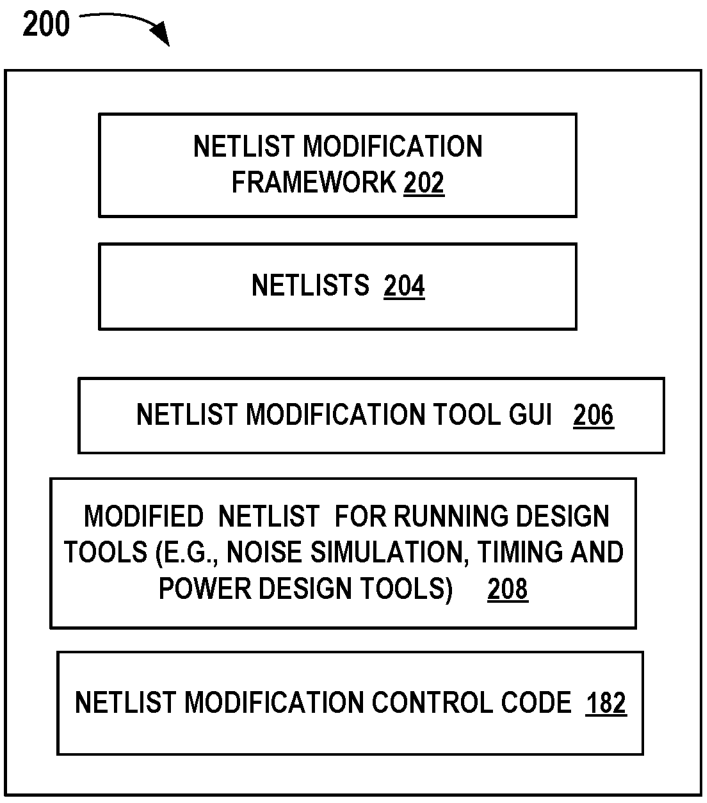
FIG. 2 is a block diagram of an example system for implementing device changes on a netlist of one or more embodiments of the present disclosure.

FIG. 2 illustrates an example system 200 for modifying a netlist to implement device changes in an IC design of disclosed embodiments. System 200 can be used in conjunction with the computer 101 and cloud environment of the computing environment 100 of FIG. 1 for implementing inventive methods of disclosed embodiments.

System 200 provides advantages enabled by a Netlist Modification Framework 202 of disclosed embodiments used together with the Netlist Modification Control Code 182. System 200 includes the Netlist Modification Framework 202 used with Netlists 204 to implement device changes in an IC design of disclosed embodiments. For example, system 200 with the disclosed Netlist Modification Framework 202 enables faster automated design steps with good approximation that supports directly making changes in the netlist 204 rather than in the schematic design view. The Netlist Modification Framework 202 optionally is constructed using an object-oriented programming language, such as a Python programming language. System 200 includes a GUI, shown as a Netlist Modification Tool GUI 206 that receives user selections and enables efficient and effective automated user selected changes to be made directly in a Modified Current Netlist 208 of disclosed embodiments. The circuit designer can run, noise simulation, timing and power design tools on the Modified Current Netlist 208, also called a modified netlist 208, eliminating the conventional steps, such as making changes to the schematic view, updating the IC layout, running parasitic extraction, and running one or more circuit simulation tools to verify operation. In conventional arrangement, the circuit designer makes changes in the HDL description of a schematic view the design, which requires generating an updated design layout to include the design changes to enable verification of the changed IC design. For example, in a disclosed embodiment, the current netlist 204 is modified directly with the design changes, eliminating the need for preparing an updated design layout. The modified netlist enables running multiple circuit simulation tools for verification of the IC design. In accordance with a disclosed embodiment, for example the circuit designer can run noise simulation and design tools on the modified netlist 208 within minutes.

Figure 3:
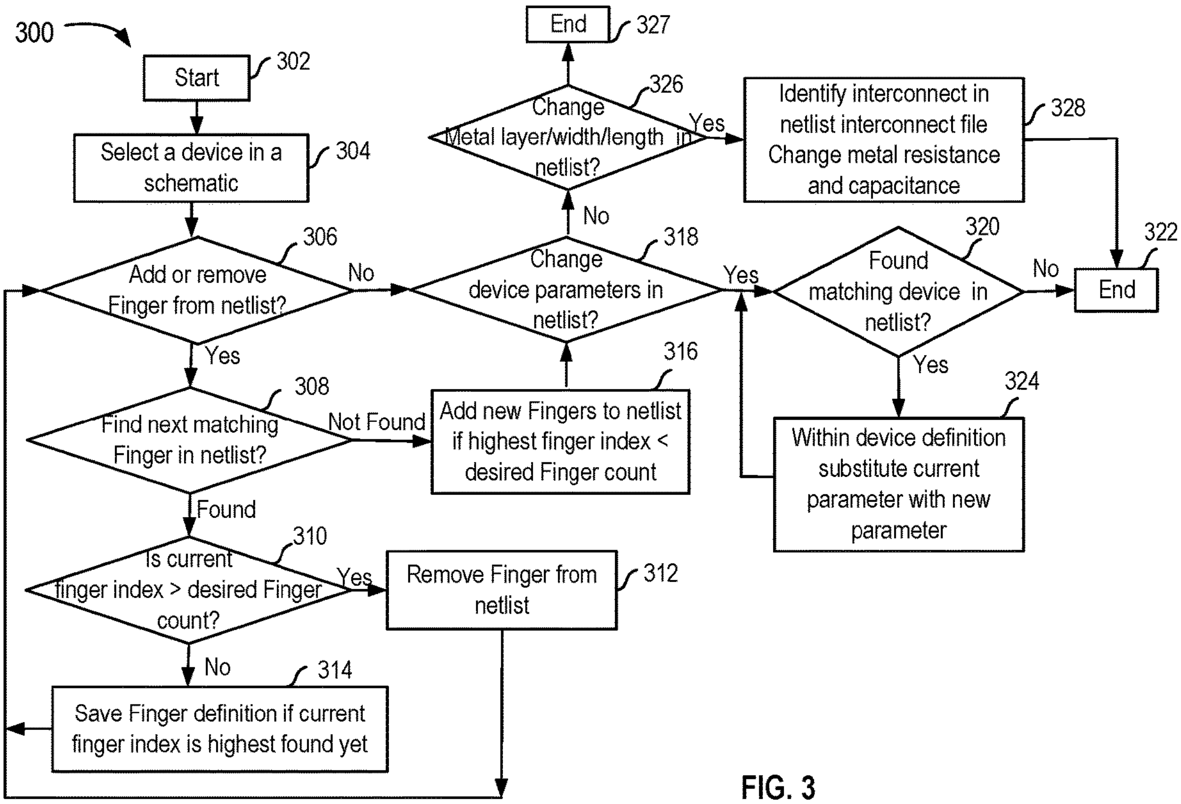
FIG. 3 is a flow chart of an example operations of an example method for implementing device changes on a netlist of one or more embodiments of the present disclosure.

FIG. 3 illustrates of an example method 300 for implementing device changes on a netlist of one or more embodiments of the present disclosure. For example, method 300 is implemented by system 200 including the Netlist Modification Framework 202 used with the Netlist Modification Control Code 182 and computer 101 in accordance with one or more disclosed embodiments of the present disclosure.

Operations of method 300 begin at block 302. At block 304, system 200 obtains a user-selected device in a schematic view of a given IC design to be processed in the netlist. For example, in a disclosed embodiment, the user-selected device is presented in a schematic view of the IC design, and a device option for selection by user is presented in the Netlist Modification Tool GUI 206. The enabled multiple possible user selections include a specific user selected device, such as a single transistor, such as a FinFET, a resistor, a capacitor, a cell or logic gate, such as an NAND gate, a NOR gate or an AND/OR gate, or an interconnect. The interconnects or nets represent the wires connecting between different pins in the netlist.

At decision block 306, system 200 checks whether a device is to be added to or removed from the netlist 204. When determined that a device is to be added to the netlist 204, system 200 checks to find a next matching Finger in the netlist at decision block 308, where the device comprises at least one finger. For example, an NFET or PFET typically includes multiple-fingers forming the transistor gate. Further, for example, the circuit designer may change a 6-finger NOR gate, selecting the change to 2-fingers or 8-fingers for the gate. When a next matching Finger is found, system 200 checks if a current finger index is greater than a desired finger count at decision block 310. For example, the current finger index may be 6 and the desired finger count 4. At decision block 312, system 200 removes the finger from the netlist when current finger index is greater than the desired finger count, e.g., to reduce the number of fingers to achieve the desired number of transistor fingers or finger count. Operations return to decision block 308 where system 200 checks to find a next matching Finger in the netlist, and operations continue as before. When the current finger index is not greater than the desired finger count, at block 314 the system saves the finger definition if the current finger index is the highest found yet. For example, the current finger index may be 6 and the desired finger count 4. For example, the current finger index may be 6 and the desired finger count 12. Operations return to decision block 308 to find a next matching Finger in the netlist, and operations continue as before.

When a next matching Finger is not found at decision block 308, at block 316 system 200 adds one or more new Fingers to the netlist if the highest Finger index is less than the desired Finger count. For example, with a new Finger count of 6 and a current highest Finger index is 4, system 200 adds one or more new Fingers to the netlist as shown at block 316. At decision block 318, system 200 checks for a change of device parameters when determined that no device is to be added or removed from the netlist 204 at decision block 306, and/or after adding the new fingers at block 316. When device parameter changes are identified at decision block 318, at decision block 320, system 200 checks if matching device was found in the netlist. If no matching device was found in the netlist, the operation end ends at block 322. When a matching device was found in the netlist, at block 324, system 200 substitutes the current parameter with the new parameter within the device definition. Operation return-returns to decision block 320, where system 200 checks if matching device was found in the netlist and continue as before. For example, the parameter change may include a change in-in threshold voltage, a number of fins per finger or a capacitor value.

When device parameter changes are not identified at decision block 318, at decision block 326, system 200 checks for a change in metal type and/or metal width (e.g. checks for a change in an interconnect to the selected device). When a change in an interconnect is not identified, operations end at block 327. In a disclosed embodiment when a change in an interconnect is identified, at block 328, system 200 identify identifies the interconnect in a netlist interconnect file and make multiple changes to the interconnect, for example change the metal resistance and capacitance, with operations ending at block 322, as shown. In a disclosed embodiment, at block 328 system 200 can modify one or more of a wire type, wire width, wire length, and wire spacing. In a disclosed embodiment, at block 328 system 200 can modify wires in the netlist, where wires are represented by segments of resistances and capacitances. For example, at block 328 system 200 can disconnect a wire by removing each segment between the source and sink of that wire from the netlist. In a disclosed embodiment, at block 328 system 200 can replace an existing wire with a new wire by using the net name of the existing wire that is replaced. Further, at block 328 system 200 can add new wires of different types, including a defined schematic wire characterization such as wire delay or a wire characterized by its type, width and length.

Figure 4:
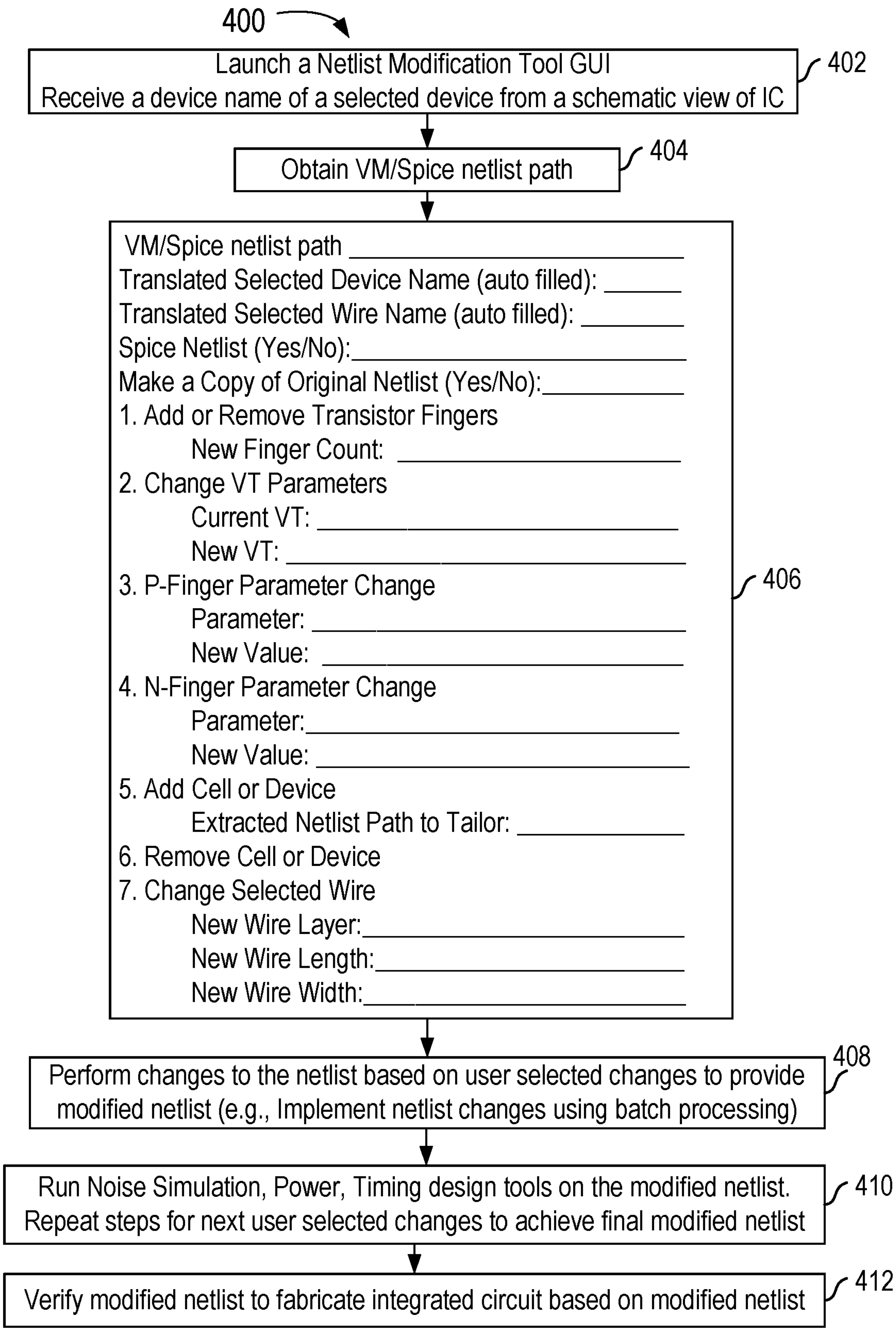
FIG. 4 is a flow chart of an example operations of an example method for obtaining selections of a device and selections of changes to be made and processed in a netlist of one or more embodiments of the present disclosure.

FIG. 4 is a flow chart of example operations of an example method 400 for obtaining user selections and processing in a netlist 204 of one or more embodiments of the present disclosure. At block 402, system 200 can launch a Netlist Modification Tool GUI 206, which enables receiving multiple user selections. For example, first a device name of a selected device is received as indicated at block 402. For example, each selected device corresponds to at least one finger (e.g. presented in a schematic view of the device of the IC design for selection by user within the Netlist Modification Tool GUI 206). At block 404, system 200 obtains a VIM or Spice netlist path for the netlist, where either zipped or unzipped files can be used. The Netlist Modification Framework 202 and the Netlist Modification Control Code 182 of disclosed embodiments support both a VIM netlist format and a conventional SPICE input file format. For example, the VIM netlist format is a highly configurable text editor built to enable efficient text editing on UNIX systems and various other systems. The SPICE input file format or source file is used extensively to simulate analog circuits, where the circuits are described using a simple circuit description language which is composed of components with terminals attached to particular nodes for a given circuit design.

At block 406, system 200 presents selection options for the user, for example to receive the VM or Spice netlist path with a translated selected device and a translated selected wire name, where the selected device can include a cell or group of devices. In a disclosed embodiment at block 406, example illustrated user selection options include a Spice netlist, make a copy of original netlist, add or remove transistor fingers, new finger count, change voltage threshold (VT) parameters, current VT and new VT, P-finger parameter change, parameter and new value, N-finger parameter change, parameter and new value. As shown, the example illustrated user selection options include add cell or device, extracted netlist path to tailor, remove cell or device, change selected wire, new wire layer, length and width. Example operations for such user selections are described above and illustrated with respect to the method 300 in FIG. 3.

In a disclosed embodiment, at block 408, system 200 implements the netlist changes based on the user selected changes, for example using batch processing to provide a modified netlist. For example, in a disclosed embodiment, various proposed changes provided by a circuit designer are implemented directly in a netlist, which enables running parasitic extraction to calculate parasitic effect in design devices and wiring interconnects, and running noise simulation tools, timing tools and power tools to verify operation as intended. In a disclosed embodiment, a matching netlist name in the netlist is identified based on the selected device. At block 408, system 200 performs, based on the selected change to the netlist, at least one of (i) changing a parameter of the selected device; (ii) adding a second selected device, for example adding at least one finger; (iii) removing a selected device, for example removing a finger from the selected device, where the selected device comprises two or more fingers; or (iv) changing an interconnect, such as changing a metal type or a metal width of the interconnect.

For example, in a disclosed embodiment, at block 408 system 200 can add the second selected device, for example by adding at least one transistor finger to the second selected device, and by adding the second selected device between the selected device and another device. Further at block 408 system 200 can remove a selected device, for example by removing a transistor finger from the selected device, where the selected device comprises two or more transistor fingers, and by removing the second selected device between the selected device and the another device. For example, in a disclosed embodiment, at block 408 system 200 can remove a cell, such as by disconnecting a cell, where the system removes each instance and device in the cell from the netlist, and also each wire associated with it (e.g., internal wires which are inside the cell and external wires that connect the cell to other parts of the design). In a disclosed embodiment, at block 408 system 200 can add a cell, such as by connecting a cell, where the system in first step generates an extracted netlist for only the specific cell, and then tailors that netlist to the extracted netlist of the design.

At block 410, system 200 runs noise simulation, power, timing design tools on the modified netlist enabling the circuit designer to evaluate the changes made directly to the netlist, without requiring a new design layout and netlist extraction of the new design layout as provided in convention arrangements. Optionally, the circuit designer can make further changes and repeat the steps from blocks 402 through block 410 to evaluate the further changes made to the netlist. In a disclosed embodiment, each iteration of circuit design changes is implemented directly in the netlist of the given IC design, enabling efficient processing and evaluation of multiple different updated designs to achieve a final design for the given IC design. At block 410, system 200 can verify the final modified netlist and to fabricate an integrated circuit based on the final modified netlist. In a disclosed embodiment, the final modified netlist is processed including a schematic change, design layout update, netlist extraction, and running design tools to provide a final signoff of the IC design for fabrication or manufacture of the integrated circuit. In a disclosed embodiment, the incremental changes or iterations of circuit design changes are implemented with significantly improved runtime performance by directly modifying the netlist, overcoming deficiencies of the existing requirements to run power and timing on each iteration of a circuit design change in the design development process.

Figure 5:
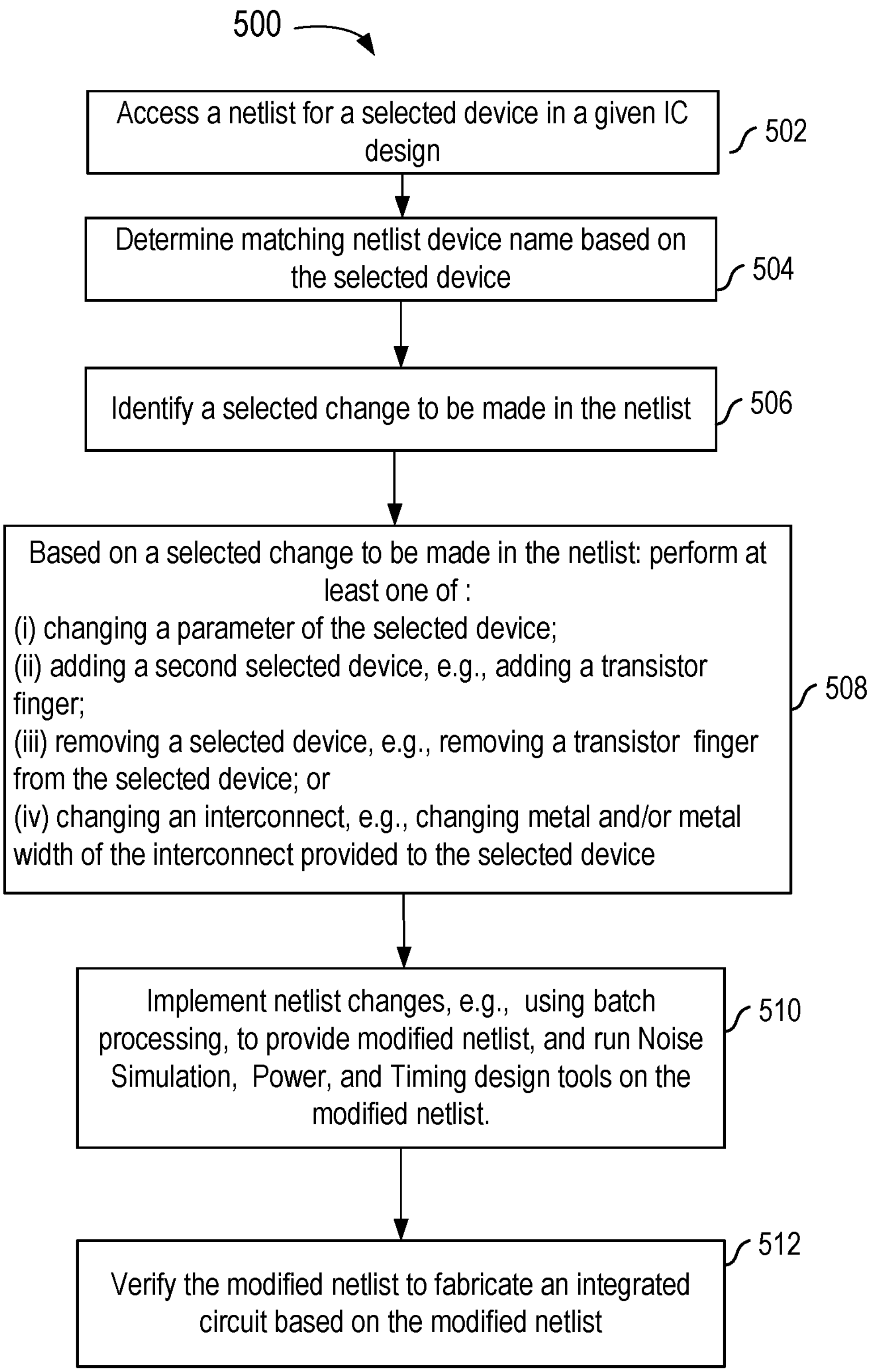
FIG. 5 is a flow chart of an example method for modifying a netlist to implement device changes in an IC design of one or more embodiments of the present disclosure.

FIG. 5 illustrates an example method 500 for modifying a netlist to implement device changes in an IC design of one or more embodiments of the present disclosure. The method 500 can be implemented by the system 200 in conjunction with the computer 101 of FIG. 1 with the Netlist Modification Framework 202 and the Netlist Modification Control Code 182 of disclosed embodiments.

At block 502, system 200 accesses a netlist for a selected device in given integrated circuit (IC). At block 502, the selected device can be presented to the circuit designer in a schematic view of the IC design and the netlist includes the user-selected format used for processing with the Netlist Modification Framework 202. At block 504, system 200 determines a matching netlist name for the user-selected device in the netlist based on the user entered device selection. At block 506, system 200 identifies a selected change to be made in the netlist based on one or more user entered change selections.

At block 508, system 200 performs, based on the selected change to the netlist, at least one of (i) changing a parameter of the selected device; (ii) adding a second selected device, for example adding at least one transistor finger; (iii) removing a selected device, for example removing a transistor finger from the selected device, where the selected device comprises two or more fingers; or (iv) changing a metal width of an interconnect. For example, at block 508 system 200 can change one or more interconnect resistance and capacitance values, and modify one or more of a wire type, wire width, wire length, and wire spacing, add or remove a device, increase or decrease a number of transistor fingers, add or remove a cell that contains a group of devices, change an instance VT type, and the like.

At block 510, system 200 implements changes to the netlist to provide the modified netlist of disclosed embodiments, for example using batch processing. At block 512, system 200 can verify the modified netlist to enable a final signoff of the updated IC design and fabricate an integrated circuit based on the verified modified netlist.

While the foregoing is directed to embodiments of the present invention, other and further embodiments of the invention may be devised without departing from the basic scope thereof, and the scope thereof is determined by the claims that follow.

What is claimed is:

1. A method comprising:

accessing a netlist for a selected device in a given integrated circuit (IC) design, the selected device being a user-selected device selected from a schematic view of the IC design;

determining, by a system based on selecting the user-selected device from the schematic view of the IC design, a matching netlist name in the netlist that corresponds to the user-selected device selected from the schematic view of the IC design;

identifying a selected change of the user-selected device to be made in the netlist, the selected change being a user-selected change specified by the user; and performing an action in the netlist, based on the selected change, to implement a change directly to the netlist to provide a modified netlist that implements in the IC design the user-selected change of the user-selected device, the user-selected device identified in the netlist using the matching netlist name.

2. The method of claim 1, wherein the selected device comprises at least one transistor finger, and wherein the performing the action in the netlist includes adding a second selected device, the adding the second selected device comprising performing an add selected from a group consisting of adding one or more transistor fingers to the selected device, and adding the second selected device between the selected device and another device.

3. The method of claim 1, wherein the performing the action in the netlist includes removing the selected device, the removing the selected device comprising performing a remove selected from a group consisting of removing a transistor finger from the selected device, wherein the selected device comprises two or more transistor fingers, and removing a second selected device between the selected device and another device.

4. The method of claim 1, wherein the performing the action in the netlist includes changing an interconnect the changing the interconnect comprising performing an interconnect change selected from a group consisting of changing a metal type, changing a metal length, and changing a metal width of the interconnect.

5. The method of claim 1, wherein the performing the action in the netlist includes changing a parameter of the selected device, the changing the parameter comprising performing a parameter change selected from a group consisting of changing a voltage threshold, changing a number of fins per finger, and changing a capacitor value.

6. The method of claim 1, wherein the performing the action in the netlist includes performing a plurality of actions in the netlist to implement a plurality of changes to the netlist to provide the modified netlist, and wherein the performing the plurality of actions comprises using batch processing.

7. The method of claim 1, further comprising verifying the modified netlist and fabricating an integrated circuit based on the modified netlist.

8. The method of claim 1, wherein the performing the action in the netlist comprises changing an interconnect, the changing the interconnect comprising:

identifying the interconnect in a netlist interconnect file; and changing a metal resistance and capacitance of the interconnect.

9. The method of claim 1, wherein the identifying the selected change to be made in the netlist further comprises presenting a Netlist Modification Tool graphical user interface (GUI) configured for receiving user selections.

10. The method of claim 1, further comprising constructing a Netlist Modification Framework using an object-oriented programming language.

11. A system, comprising:

a processor; and a memory, wherein the memory includes a computer program product configured to perform operations for modifying a netlist to implement device changes in an integrated circuit (IC) design, the operations comprising:

accessing the netlist for a selected device in a given integrated circuit (IC) design, the selected device being a user-selected device selected from a schematic view of the IC design;

determining, by a system based on selecting the user-selected device from the schematic view of the IC design, a matching netlist name in the netlist that corresponds to the user-selected device selected from the schematic view of the IC design;

identifying a selected change of the user selected device to be made in the netlist, the selected change being a user-selected change specified by the user; and performing an action in the netlist, based on the selected change, to implement a change directly to the netlist to provide a modified netlist that implements in the IC design the user-selected change of the user-selected device, the user-selected device identified in the netlist using the matching netlist name.

12. The system of claim 11, wherein the selected device comprises at least one transistor finger, and wherein the performing the action in the netlist includes adding a second selected device, the adding the second selected device comprising performing an add selected from a group consisting of adding one or more transistor fingers to the selected device, and adding the second selected device between the selected device and another device.

13. The system of claim 11, wherein the performing the action in the netlist includes changing an interconnect the changing the interconnect comprising performing an interconnect change selected from a group consisting of changing a metal type, changing a metal length, and changing a metal width of the interconnect.

14. The system of claim 11, wherein the identifying the selected change to be made in the netlist further comprises presenting a Netlist Modification Tool graphical user interface (GUI) configured for receiving user selections.

15. The system of claim 11, wherein the performing the action in the netlist comprises changing an interconnect, the changing the interconnect comprising:

identifying the interconnect in a netlist interconnect file; and changing a metal resistance and capacitance of the interconnect.

16. A computer program product for modifying a netlist to implement device changes in an integrated circuit (IC) design, the computer program product comprising:

a computer-readable storage medium having computer-readable program code embodied therewith, the computer-readable program code executable by one or more computer processors to perform an operation comprising:

accessing the netlist for a selected device in a given integrated circuit (IC) design, the selected device being a user-selected device selected from a schematic view of the IC design;

determining, by a system based on selecting the user-selected device from the schematic view of the IC design, a matching netlist name in the netlist that corresponds to the user-selected device selected from the schematic view of the IC design;

identifying a selected change of the user-selected device to be made in the netlist, the selected change being a user-selected change specified by the user; and performing an action in the netlist, based on the selected change, to implement a change directly to the netlist to provide a modified netlist that implements in the IC design the user-selected change of the user-selected device, the user-selected device identified in the netlist using the matching netlist name.

17. The computer program product of claim 16, wherein the selected device comprises at least one transistor finger, and wherein the performing the action in the netlist includes adding a second selected device, the adding the second selected device comprising performing an add selected from a group consisting of adding one or more transistor fingers to the selected device, and adding the second selected device between the selected device and another device.

18. The computer program product of claim 16, wherein the performing the action in the netlist includes changing an interconnect, the changing the interconnect comprising performing an interconnect change selected from a group consisting of changing a metal type, changing a metal length, and changing a metal width of the interconnect.

19. The computer program product of claim 16, wherein the identifying the selected change to be made in the netlist further comprises presenting a Netlist Modification Tool graphical user interface (GUI) configured for receiving user selections.

20. The computer program product of claim 16, wherein the performing the action in the netlist comprises changing an interconnect, the changing the interconnect comprising:

identifying the interconnect in a netlist interconnect file; and changing a metal resistance and capacitance of the interconnect.

* * * * *